(12) United States Patent  
Yamanaka

(10) Patent No.: US 8,142,205 B2
(45) Date of Patent: Mar. 27, 2012

(54) ELECTRONIC APPARATUS

(75) Inventor: Yasunori Yamanaka, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 13/008,913

(22) Filed: Jan. 19, 2011

(65) Prior Publication Data

US 2011/0230062 A1   Sep. 22, 2011

(30) Foreign Application Priority Data

Mar. 19, 2010 (JP) ................. 2010-065078
Apr. 20, 2010 (JP) ................. 2010-097334

(51) Int. Cl.
H01R 12/00 (2006.01)
(52) U.S. Cl. ........................ 439/76.1; 439/55
(58) Field of Classification Search .......... 439/55, 439/76.1; 361/690
See application file for complete search history.

(56) References Cited

U.S. PATENT DOCUMENTS

| 4,047,242 | A | * | 9/1977 | Jakob et al. | 361/714 |
| 4,231,629 | A | * | 11/1980 | Kirby | 439/63 |
| 5,497,289 | A | | 3/1996 | Sugishima et al. | |
| 6,341,063 | B2 | * | 1/2002 | Kinoshita et al. | 361/690 |
| 6,769,932 | B1 | * | 8/2004 | Daoud | 439/532 |
| 7,369,413 | B2 | * | 5/2008 | Caines et al. | 361/719 |
| 7,445,468 | B2 | * | 11/2008 | Chen et al. | 439/76.1 |
| 7,452,213 | B2 | * | 11/2008 | Herdendorf et al. | 439/67 |
| 7,458,823 | B2 | * | 12/2008 | Sugimoto et al. | 439/76.1 |

FOREIGN PATENT DOCUMENTS

JP  06-169578  6/1994

* cited by examiner

Primary Examiner — James Harvey
(74) Attorney, Agent, or Firm — Ditthavong Mori & Steiner, P.C.

(57) ABSTRACT

An electronic apparatus includes a housing; a terminal block fixed to the housing at both ends thereof in a width direction; and a printed circuit board extending in a depth direction of the terminal block, one end of the printed circuit board in the depth direction being fixed to the housing, and the other end of the print circuit board in the depth direction being fixed to the terminal block at a position below the terminal block.

20 Claims, 2 Drawing Sheets

ELECTRONIC APPARATUS

CROSS-REFERENCE TO RELATED APPLICATION

The present application claims priority under 35 U.S.C. §119 to Japanese Patent Application No. 2010-065078, filed Mar. 19, 2010 and Japanese Patent Application No. 2010-097334, filed Apr. 20, 2010. The contents of these applications are incorporated herein by reference in their entirety.

BACKGROUND OF THE INVENTION

1. Field of the Invention

The present invention relates to an electronic apparatus.

2. Discussion of the Background

Electronic apparatuses, such as inverter devices, include a housing that serves as a base or a case, a printed circuit board that is fixed to the housing, and a terminal block that is mounted on the printed circuit board (see, for example, Japanese Unexamined Patent Application Publication No. 6-169578 disclosed on Jun. 14, 1994). To be specific, the terminal block is mounted on the printed circuit board by flow soldering, and the printed circuit board, on which the terminal block has been mounted, is fixed to the housing.

SUMMARY OF THE INVENTION

According to an aspect of the present invention, an electronic apparatus includes a housing; a terminal block fixed to the housing at both ends thereof in a width direction; and a printed circuit board extending in a depth direction of the terminal block, one end of the printed circuit board in the depth direction being fixed to the housing, and the other end of the printed circuit board in the depth direction being fixed to the terminal block at a position below the terminal block.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
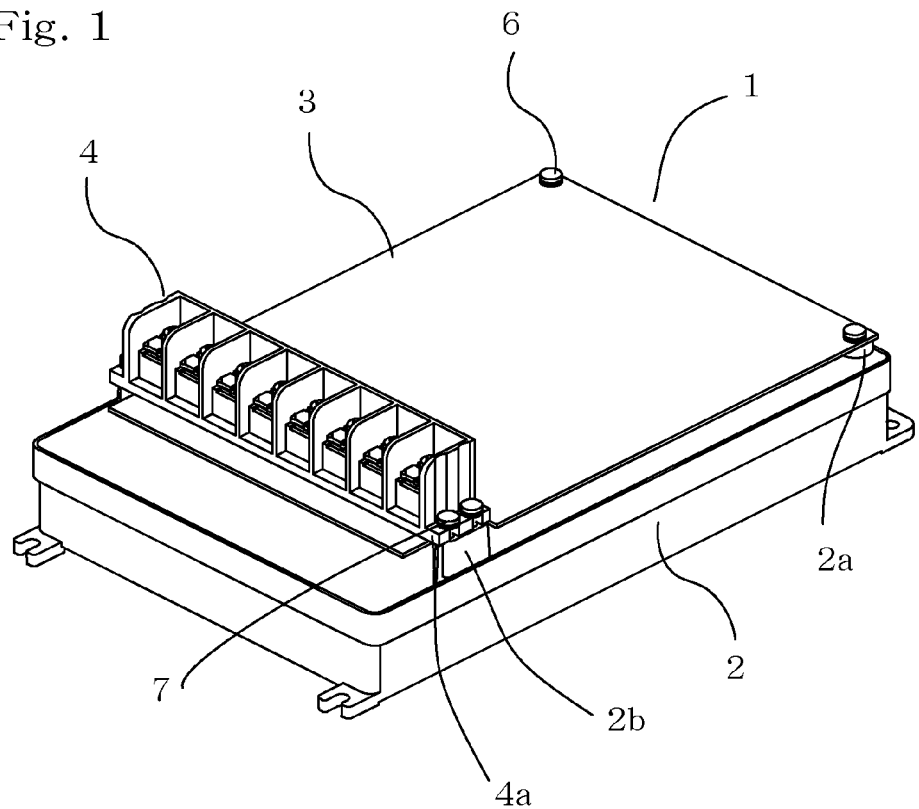
FIG. 1 is a perspective view illustrating a main part of an electronic apparatus according to a first embodiment of the present invention.

Embodiments will now be described with reference to the accompanying drawings, wherein like reference numerals designate corresponding or identical elements throughout the various drawings, and redundant description will be omitted.

First Embodiment

Figure 2:
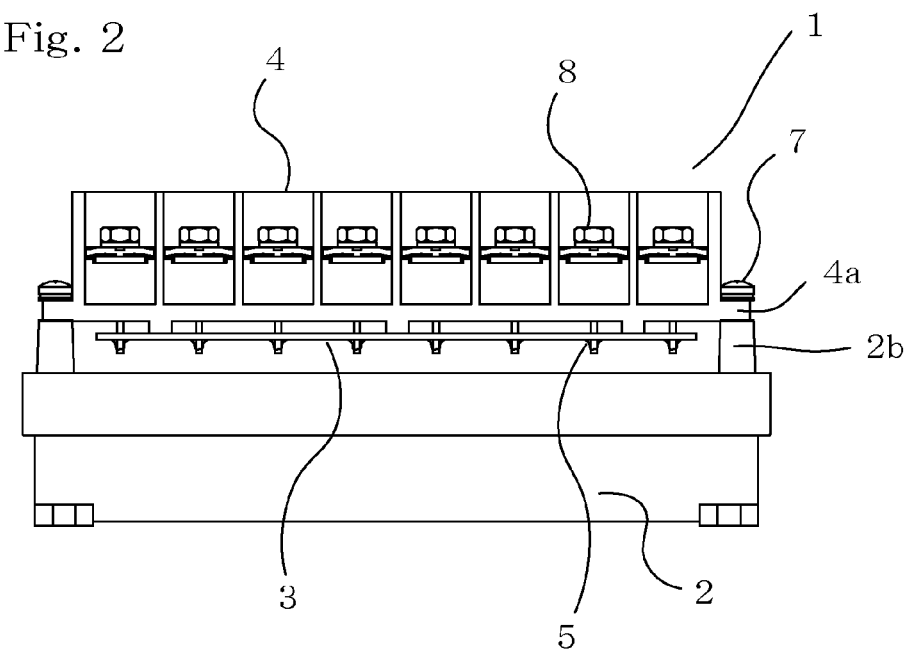
FIG. 2 is a front view of the electronic apparatus of FIG. 1 viewed from a terminal block side.

Referring to FIGS. 1 and 2, the structure of an electronic apparatus according to a first embodiment of the present invention will be described.

FIG. 1 is a perspective view illustrating a main part of an electronic apparatus 1 according to a first embodiment of the present invention. FIG. 2 is a front view of the electronic apparatus 1 viewed from a terminal block side. The electronic apparatus 1 is, for example, an inverter device. For ease of understanding, FIGS. 1 and 2 illustrate only a main part of the electronic apparatus 1.

As illustrated in FIG. 1, the electronic apparatus 1 according to the present embodiment includes a housing 2 that serves as a base or a case. Circuit board mounting bases 2a are disposed at one end of the upper surface of the housing 2. Terminal block mounting bases 2b are disposed at the other end of the upper surface of the housing 2. The printed circuit board mounting bases 2a and the terminal block mounting bases 2b may be protrusions integrally formed with the housing 2, or may be spacers that are independent from the housing 2. A printed circuit board 3 is attached to the housing 2. Instead of being entirely attached, only one end of the printed circuit board 3 is attached to the printed circuit board mounting bases 2a on the housing 2. The other end of the printed circuit board 3 is attached to a terminal block 4 that is fixed to the housing 2.

The printed circuit board 3 is attached to the terminal block 4 by mounting the terminal block 4 onto the printed circuit board 3. First, leads 5 for soldering that extend from the terminal block 4 are connected to the printed circuit board 3 by soldering. Then, one end of the printed circuit board 3 (an end at which the terminal block is not mounted) is placed on the circuit board mounting bases 2a of the housing 2, and fixed with fixing screws 6. The other end of the printed circuit board 3 (an end at which the terminal block is mounted) is not directly fixed to the housing 2. Instead, the other end is connected and fixed to the terminal block 4, and the terminal block 4 is fixed to the housing 2.

The length of the terminal block 4 in the width direction is larger than the length of the printed circuit board 3 in the width direction. Parts of the terminal block 4 that extend beyond the edges of the printed circuit board 3 in the width direction are used to fix the terminal block 4 to the housing 2. That is, the parts serve as fastening bases 4a that contact the terminal block mounting bases 2b. As illustrated in FIGS. 1 and 2, in order to make the length of the terminal block 4 in the width direction be larger than the length of the printed circuit board 3 in the width direction, portions of the printed circuit board 3 that correspond to the ends of the terminal block 4 may be cut out.

Thus, the terminal block 4 is supported not by the printed circuit board 3 but by the housing 2, and the terminal block 4 supports the other end of the printed circuit board 3. Therefore, an excessive stress is not applied to the printed circuit board 3 when a thick electric wire is connected to a terminal screw 8 of the terminal block 4. Therefore, even if the terminal block 4 has a large current-carrying capacity and has a large size, the terminal block 4 can be mounted on the printed circuit board 3 by soldering. Moreover, the strength with which the terminal block 4 is fixed is not dependent on soldering. Therefore, even if the terminal block 4 has a large current-carrying capacity and has a large size, the terminal block 4 can be mounted on the printed circuit board 3 at the same time as other electric components by flow soldering. Furthermore, the other end of the printed circuit board 3 (the end at which the terminal block is mounted) is not directly fixed to the housing 2. Therefore, when fixing the terminal block 4, which has been mounted on the printed circuit board 3, to the housing 2, the printed circuit board 3 does not become warped due to displacement caused by an assembly operation. Accordingly, stress does not concentrate on a soldered portion of the leads 5 for soldering, and a solder crack does not occur.

With existing technologies, the terminal block 4 is mounted on the printed circuit board 3, and thereby the terminal block 4 is electrically connected to the printed circuit board 3 and the terminal block 4 is fixed to the printed circuit board 3. In contrast, with the present invention, the terminal block 4 is connected to the printed circuit board 3 so that the terminal block 4 is electrically connected to the printed circuit board 3 and so that the printed circuit board 3 is fixed to the terminal block 4 without being influenced by how the terminal block 4 is fixed.

As illustrated in FIG. 2, because the fixing parts at the ends of the terminal block 4 are disposed above the component-mounting surface of the printed circuit board 3, the terminal block 4 can be soldered to the printed circuit board 3 at the same time as other electric components that are mounted on the printed circuit board 3 by flow soldering, and thereafter the terminal block 4 can be fixed to the housing 2 with fixing screws 7. One end of the printed circuit board 3 (the end at which the terminal block is not mounted) is directly fixed to the housing 2, but the other end (the end at which the terminal block is mounted) is not directly fixed to the housing 2. Therefore, excessive stress is not applied to the printed circuit board 3 when the terminal block 4 is fixed to the housing 2.

Second Embodiment

Heretofore, the electronic apparatus 1 according to the first embodiment of the present invention has been described. Next, referring to FIGS. 3 and 4, an electronic apparatus 1A according to a second embodiment of the present invention will be described.

Figure 3:
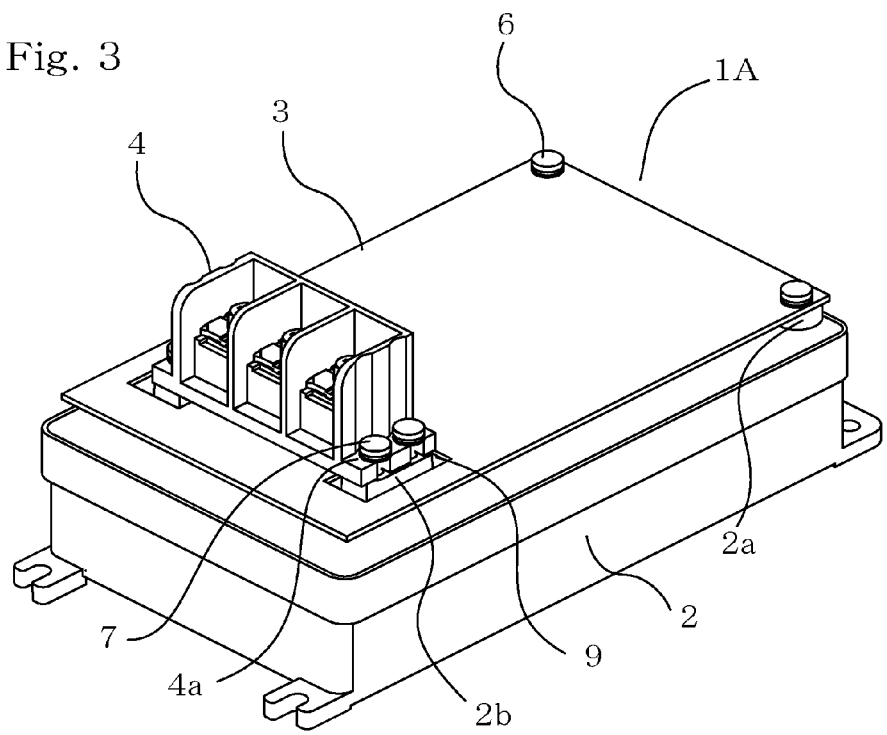
FIG. 3 is a perspective view illustrating a main part of an electronic apparatus according to a second embodiment of the present invention.
Figure 4:
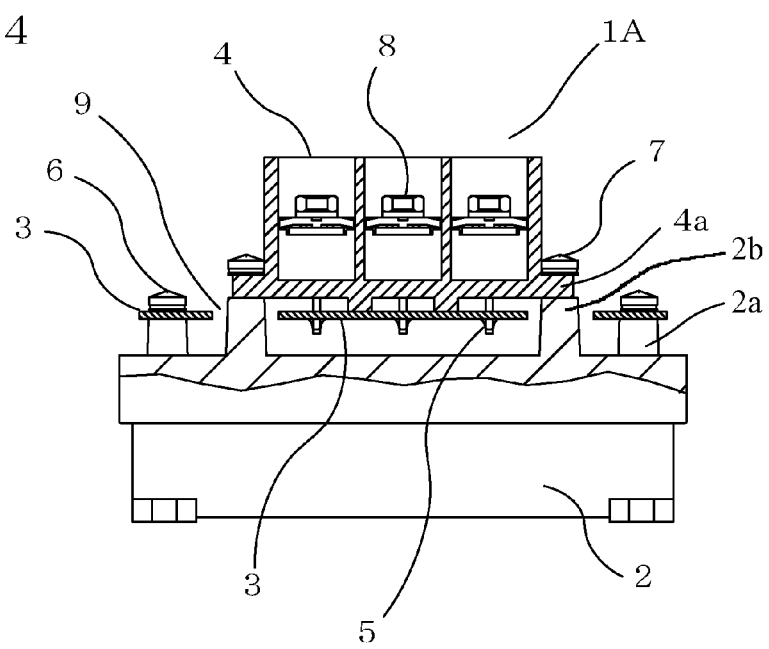
FIG. 4 is a sectional view of the electronic apparatus of FIG. 3 viewed from a terminal block side.

FIG. 3 is a perspective view illustrating a main part of the electronic apparatus 1A according to the second embodiment of the present invention. FIG. 4 is a sectional view of the electronic apparatus 1A viewed from the terminal block side. In the first embodiment, a part of the printed circuit board 3 is cut out so that the terminal block mounting bases 2b do not interfere with the printed circuit board 3. In the second embodiment, holes 9 are formed in the printed circuit board 3 and the terminal block mounting bases 2b are inserted into the holes 9 so that the terminal block mounting bases 2b do not interfere with the printed circuit board 3. Thus, when the terminal block 4 is disposed away from the edges of the printed circuit board 3 in the width direction and toward the center, the effective area of the printed circuit board 3 is not reduced.

Thus, the terminal block is supported not by the printed circuit board but by the housing, and the terminal block supports the other end of the printed circuit board. Therefore, even if a thick electric wire is connected to the terminal block, an excessive stress is not applied to the printed circuit board. Accordingly, a terminal block having a large current-carrying capacity and a large size can be mounted on the printed circuit board by soldering.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An electronic apparatus comprising:
    a housing;
    a first terminal block mounting base protruding from the housing in a first direction;
    a terminal block extending in a second direction perpendicular to the first direction and including a first block end and a second block end in the second direction, the first block end being fixed to an end face of the first terminal block mounting base; and
    a printed circuit board extending in a third direction perpendicular to the first and second directions and including a first end and a second end in the third direction, the first end of the printed circuit board being fixed to the housing, the second end of the print circuit board being fixed to only the terminal block and being disposed between the terminal block and the housing in the first direction, the second end of the print circuit board being closer to the housing than the end face of the first terminal block mounting base in the first direction.

2. The electronic apparatus according to claim 1,
    wherein the printed circuit board is fixed to the terminal block by soldering.

3. The electronic apparatus according to claim 2,
    wherein the terminal block is mounted on the printed circuit board by flow soldering.

4. The electronic apparatus according to claim 1,
    wherein the first terminal block mounting base is disposed on the housing at a position corresponding to a first cut-out portion of the printed circuit board.

5. The electronic apparatus according to claim 1,
    wherein the first terminal block mounting base is inserted in a first hole formed in the printed circuit board.

6. The electronic apparatus according to claim 4, further comprising:
    a second terminal block mounting base protruding from the housing in the first direction,
    wherein the second block end of the terminal block is fixed to an end face of the second terminal block mounting base, and
    wherein the second end of the print circuit board is closer to the housing than the end face of the second terminal block mounting base in the first direction.

7. The electronic apparatus according to claim 6,
    wherein the second end of the print circuit board is disposed between the first and second terminal block mounting bases in the second direction.

8. The electronic apparatus according to claim 6,
    wherein the second terminal block mounting base is disposed on the housing at a position corresponding to a second cut-out portion of the printed circuit board.

9. The electronic apparatus according to claim 8,
    wherein the second end of the printed circuit board is disposed between the first and second cut-out portions in the second direction.

10. The electronic apparatus according to claim 6,
    wherein a clearance is provided between the second end of the printed circuit board and the first terminal block mounting base in the second direction, and
    wherein a clearance is provided between the second end of the printed circuit board and the second terminal block mounting base in the second direction.

11. The electronic apparatus according to claim 6,
    wherein the first and second terminal block mounting bases are disposed between the terminal block and the housing in the first direction.

12. The electronic apparatus according to claim 6,
    wherein the first terminal block mounting base is in contact with the first block end of the terminal block, and wherein the second terminal block mounting base is in contact with the second block end of the terminal block.

13. The electronic apparatus according to claim 5, further comprising:
a second terminal block mounting base protruding from the housing in the first direction,
wherein the second block end is fixed to an end face of the second terminal block mounting base, and
wherein the second end of the print circuit board is closer to the housing than the end face of the second terminal block mounting base in the first direction.

14. The electronic apparatus according to claim 13,
wherein the second terminal block mounting base is inserted in a second hole formed in the printed circuit board.

15. The electronic apparatus according to claim 14,
wherein the second end of the printed circuit board is disposed between the first and second holes in the second direction.

16. The electronic apparatus according to claim 13,
wherein a clearance is provided between the second end of the printed circuit board and the first terminal block mounting base in the second direction, and
wherein a clearance is provided between the second end of the printed circuit board and the second terminal block mounting base in the second direction.

17. The electronic apparatus according to claim 13,
wherein the first and second terminal block mounting bases are disposed between the terminal block and the housing in the first direction.

18. The electronic apparatus according to claim 13,
wherein the first terminal block mounting base is in contact with the first block end of the terminal block, and
wherein the second terminal block mounting base is in contact with the second block end of the terminal block.

19. The electronic apparatus according to claim 1,
wherein the second end of the printed circuit board is shorter than the first end of the printed circuit board in the second direction.

20. The electronic apparatus according to claim 1,
wherein the second end of the printed circuit board is shorter than the terminal block in the second direction.

* * * * *